United States Patent
Liou et al.

(10) Patent No.: US 10,290,551 B2
(45) Date of Patent: May 14, 2019

(54) OVERLAY MARK AND METHOD FOR EVALUATING STABILITY OF SEMICONDUCTOR MANUFACTURING PROCESS

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/495,942

(22) Filed: Apr. 24, 2017

(65) Prior Publication Data

US 2018/0233419 A1 Aug. 16, 2018

(30) Foreign Application Priority Data

Feb. 15, 2017 (TW) .............................. 106104867 A (51) Int. Cl.
*H01L 21/66* (2006.01)
*H01L 23/544* (2006.01)
*G03F 7/20* (2006.01)

(52) U.S. Cl.
CPC .......... *H01L 22/12* (2013.01); *G03F 7/70633* (2013.01); *G03F 7/70683* (2013.01); *H01L 22/30* (2013.01); *H01L 23/544* (2013.01); *H01L 2223/5442* (2013.01); *H01L 2223/5446* (2013.01); *H01L 2223/54426* (2013.01)

(58) Field of Classification Search
None
See application file for complete search history.

(56) References Cited

U.S. PATENT DOCUMENTS

| 8,881,066 | B2 | 11/2014 | Shieh | |
|---|---|---|---|---|
| 9,437,415 | B2 | 9/2016 | Shieh | |
| 2009/0246709 | A1* | 10/2009 | Nakasugi | B82Y 10/00 430/319 |
| 2009/0291513 | A1* | 11/2009 | Ghinovker | G03F 7/70633 438/16 |
| 2013/0107259 | A1* | 5/2013 | Choi | G03F 7/70683 356/401 |
| 2013/0147066 | A1* | 6/2013 | Cheng | G03F 7/70633 257/797 |
| 2016/0093573 | A1* | 3/2016 | Liou | G03F 7/70633 257/741 |

* cited by examiner

*Primary Examiner* — Khaja Ahmad
(74) *Attorney, Agent, or Firm* — Winston Hsu (57) ABSTRACT

The present invention provides an overlay mark, including a substrate and plural sets of first pattern block and second pattern block. A first direction and a second direction are defined on the substrate, wherein the first direction and the second direction are perpendicular to each other. In each set, the first pattern block is rotational symmetrical to the second pattern block. Each first pattern block includes a big frame and plural small frame. Each second pattern block includes a big frame and plural small frame. The width of the big frame is greater than three times of the width of the small frame. The present invention further provides a method for evaluating the stability of a semiconductor manufacturing process.

13 Claims, 10 Drawing Sheets

OVERLAY MARK AND METHOD FOR EVALUATING STABILITY OF SEMICONDUCTOR MANUFACTURING PROCESS

BACKGROUND OF THE INVENTION

1. Field of the Invention

The present invention relates to an overlay mark and a method for evaluating process stability of a semiconductor manufacturing process, and more particularly to an overlay mark integrated in a self-aligned double patterning (SADP) process and a method for evaluating process stability of a SADP process.

2. Description of the Prior Art

In a variety of manufacturing and production settings, there is a need to control alignment between various layers or within particular layers of a given sample. For example, in the context of semiconductor processing, semiconductor-based devices may be produced by fabricating a series of layers on a substrate, some or all of the layers including various structures. The relative position of the structures both within a single layer and with respect to structures in other layers is critical to the performance of the devices. The misalignment between various structures is known as overlay error.

The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below and to the determination of how accurately a first pattern aligns with respect to a second pattern disposed on the same layer. Presently, overlay measurements are performed via test patterns that are printed together with layers of the wafer. However, there are some shortcomings of conventional solutions such as asymmetry of patterned line profile that may bring to measurement error due to the inconsistent in x/y overlay direction measurement.

SUMMARY OF THE INVENTION

It is one of the primary objectives of the present invention to provide an overlay mark and a method for evaluating process stability of a semiconductor manufacturing process, which can be used in a self-aligned double patterning (SADP) process.

To achieve the purpose described above, the present invention provides an overlay mark including a substrate and a plurality set of first pattern blocks and second pattern blocks. The substrate has a first direction and a second direction perpendicular to the first direction defined thereon. In each set of the first pattern blocks and the second pattern blocks, the first pattern block is rotational symmetrical to the second pattern blocks along a center, each of the first pattern blocks comprises a big frame and a plurality of small frames, each of the second pattern blocks comprises a big frame and a plurality of small frames, and widths of the big frames are at least three times greater than widths of the small frames.

To achieve the purpose described above, the present invention provides a method for evaluating process stability of a semiconductor manufacturing process including following steps. First of all, a substrate is provided, and the substrate has a first direction and a second direction perpendicular to the first direction defined thereon. Then, a semiconductor process is performed to form an overlay mark, the overlay mark includes a plurality set of first pattern blocks and second pattern blocks, wherein in each set of the first pattern blocks and the second pattern blocks, the first pattern block is rotational symmetrical to the second pattern blocks along a center. Each of the first pattern blocks includes a big frame and a plurality of small frames, each of the second pattern blocks includes s a big frame and a plurality of small frames and the sets of the first pattern blocks and the second pattern blocks include a plurality of first sets and a plurality of second sets, wherein the first sets of the first pattern blocks and the second pattern blocks, long edges of the big frames and the second frames are paralleled to the second direction, and a width of short edges of the big frame is at least three times greater than a width of short edges of the small frames. Next, the overlay mark is measured to obtain a plurality of values G1. Finally, a variation of the values G1 is calculated to decide a process stability of the semiconductor process in the first direction.

Overall speaking, the present invention provides an overlay mark and a method for valuating process stability of a semiconductor manufacturing process, and which is preferably integrated with a SADP process, so as to acute measuring the vary widths in the pattern.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

The present invention is directed to an overlay mark. In current semiconductor process, the critical dimension of patterns are shrinking and there are many factors that may affect the final dimension of the fin structures when performing advanced manufacturing process such as self aligned double patterning (SADP). Thus, the size of each fin structure may be variant. The present invention therefore provides an overlay mark to measure if there are shifts in x-axis or in y-axis when preforming a semiconductor process, thereto evaluate the stability of said semiconductor process.

Figure 1:
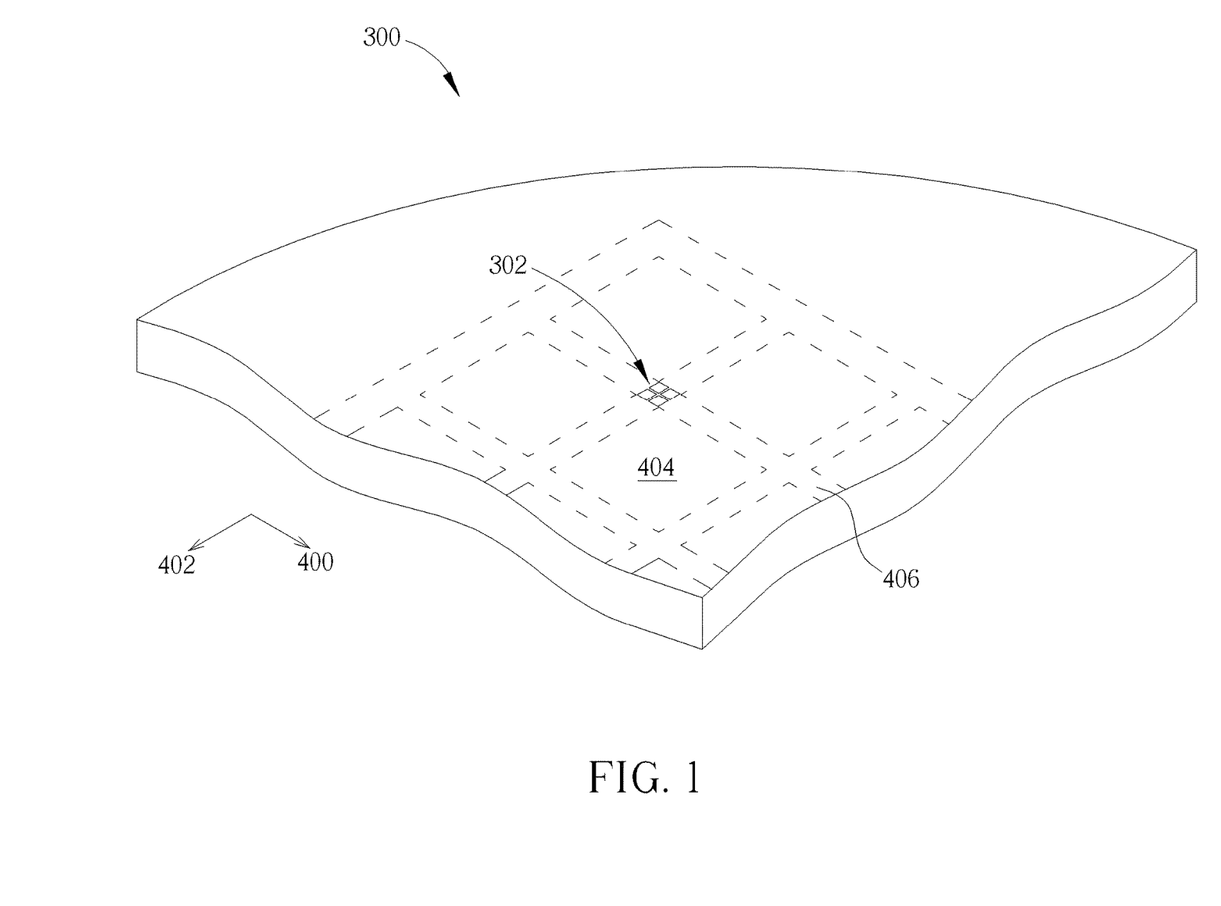
FIG. 1 is a schematic diagram illustrating a position of an overlay mark of the present invention in a wafer.

Please refer to FIG. 1, which show schematic diagrams of the overlay mark on a wafer according to one embodiment of the present invention. As shown in FIG. 1, a wafer 300 has a plurality of die regions 404, which are arranged in array preferably, and a plurality of dicing regions 406, which are disposed between the die regions 404. The dicing regions 406 are parallel to a first direction 400 or a second direction 402, wherein in preferred embodiment the first direction 400 is perpendicular to the second direction 402. The overlay mark 302 provided in the present invention can be disposed in the same area as the conventional aligning marks, such as in the dicing regions 406, and preferably in the dicing region 406 positioned between four die regions 404. In another embodiment, the overlay mark 302 can be disposed in the die region 404, depending on the design of products.

Figure 2:
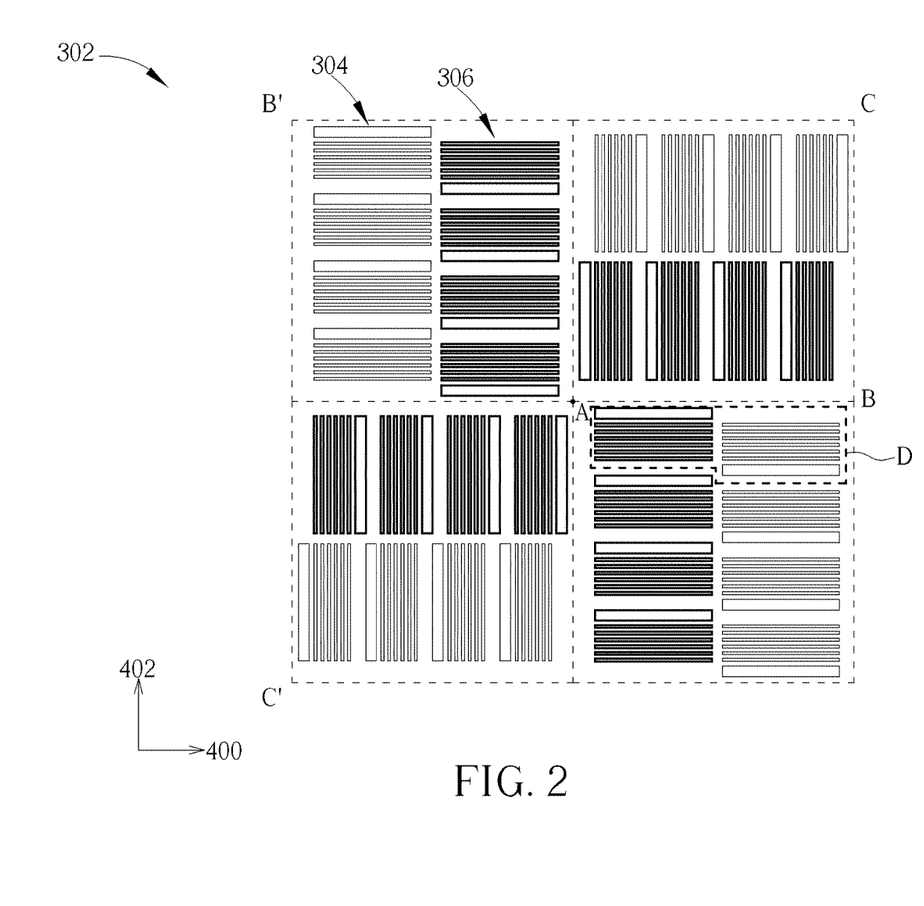
FIG. 2 and FIG. 3 are schematic diagrams illustrating an overlay mark according to a preferred embodiment of the present invention.
Figure 3:
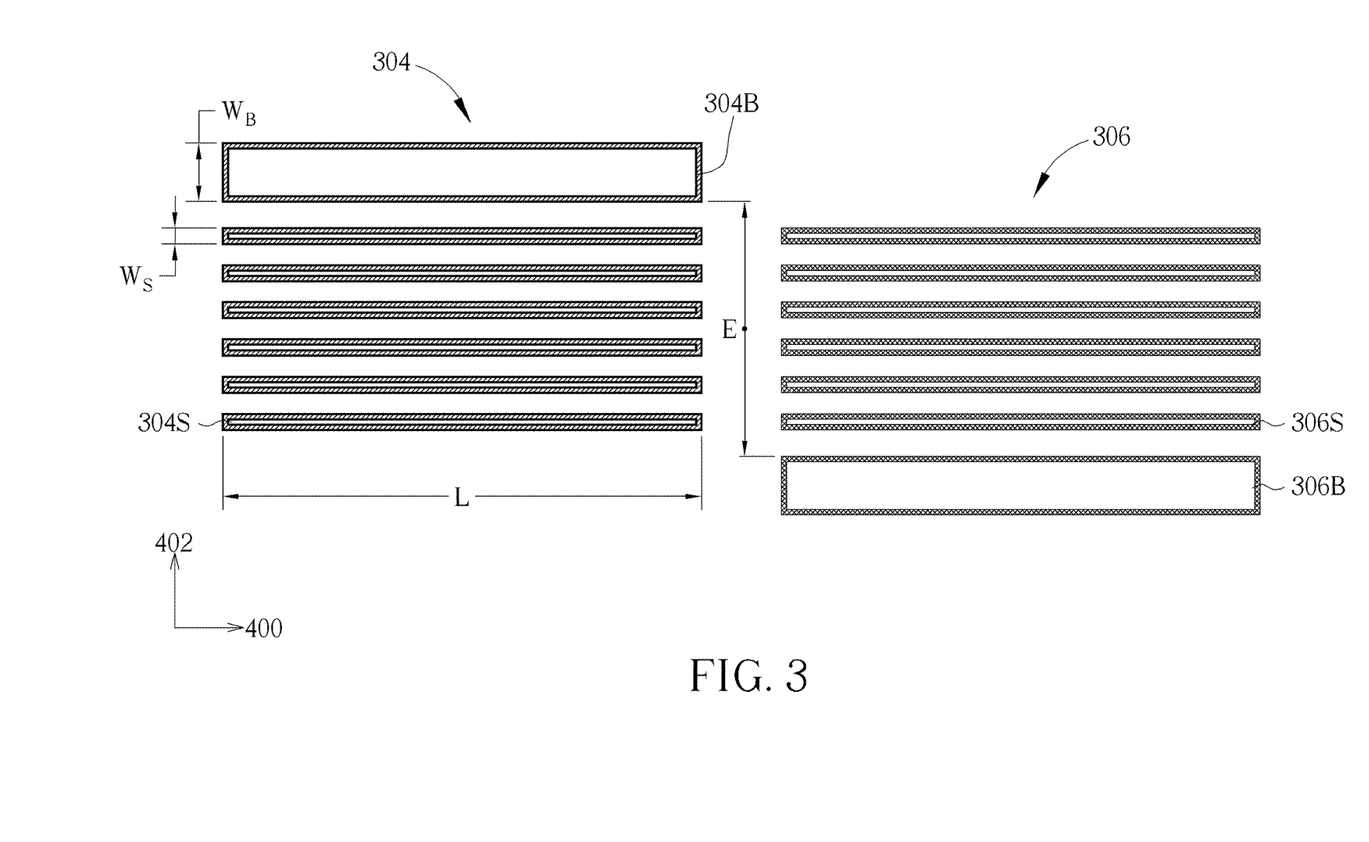

Please refer to FIG. 2 and FIG. 3, which illustrating a schematic diagram of the overlay mark according to one embodiment of the present invention, wherein FIG. 3 shows an enlarged picture from FIG. 2 in region D. Please refer to FIG. 2 first. The overlay mark 302 in the present invention includes a plurality sets of first pattern blocks 304 and second pattern blocks 306. The first pattern block 304 and the second pattern block 306 in region D refers to the same set. In one preferred embodiment, the plural sets of the first pattern block 304 and the second pattern block 306 are regularly arranged by lines and rows, so the overlaying mark 302 exhibits a pinwheel array from the top view. Detail speaking, when the overlay mark 302 is rotated 180 degrees with respect to a center A, the patterns before and after rotating are invariant, and thus exhibiting a rotational symmetrically. Taking the embodiment in FIG. 2 for example, there are four sets of the first pattern blocks 304 and the second pattern blocks 306 in region B, and when rotating 180 degrees for the patterns in region B with respect to center A, the patterns may coincide with the patterns in region B'. Similarly, there are four sets of the first pattern blocks 304 and the second pattern blocks 306. Also, after rotating, the pattern in region C may coincide with the pattern in region C'.

About the detailed structure of the aligning mark, please see FIG. 3, which shows one set of the first pattern block 304 and the second pattern block 306. As shown in FIG. 3, the first pattern block 304 includes one big frame 304B and a plurality of small frames 304S. The big frame 304B and the small frame 304 extend along the first direction 400, meaning that both of the their lengths are parallel to the first direction 400. In one embodiment, the big frame 304B and the small frame 306B have the same frame thickness T. In the first pattern block 304, the big frame 304B is positioned at the border of the first pattern block 304, meaning that all the small frames 304S are positioned at one side of the big frame 304B while there are no small frames 304S at the other side. In one embodiment, the big frame 304B and the small frame 304S have the same length L, but the width $W_B$ of the big frame 304B is substantially 3 times greater than the width $W_S$ of the small frame 304S. Similarity, the second pattern block 306 includes one big frame 306B and a plurality of small frames 306S, wherein the arrangements of these frames are similar to those in the first pattern block 304. It is noted that the big frame 306B and the small frame 306S of the second pattern block 306 would be disposed at the corresponding position with respect to that of the big frame 304B and the small frame 304S of the first pattern block 304. That is, the big frame 304B of the first pattern block 304 resides at one side of the first pattern block 304 and the second pattern block 306, and the big frame 306B of the second pattern block 306 resides at the other side of the first pattern block 304 and the second pattern block 306. In one embodiment, the number of the small frames 306S in the second pattern block 306 is equal to the number of the small frames 304S in the first pattern block 304, and the small frames 304S of the first pattern block 304 and the small frames 306S of the second pattern block 306 are aligned with each other. In this manner, the first pattern block 304 and the second pattern block 306 are rotational asymmetrical with respect to the center E, which refers to the center point of the first pattern block 304 of the second pattern block 306.

Figure 4:
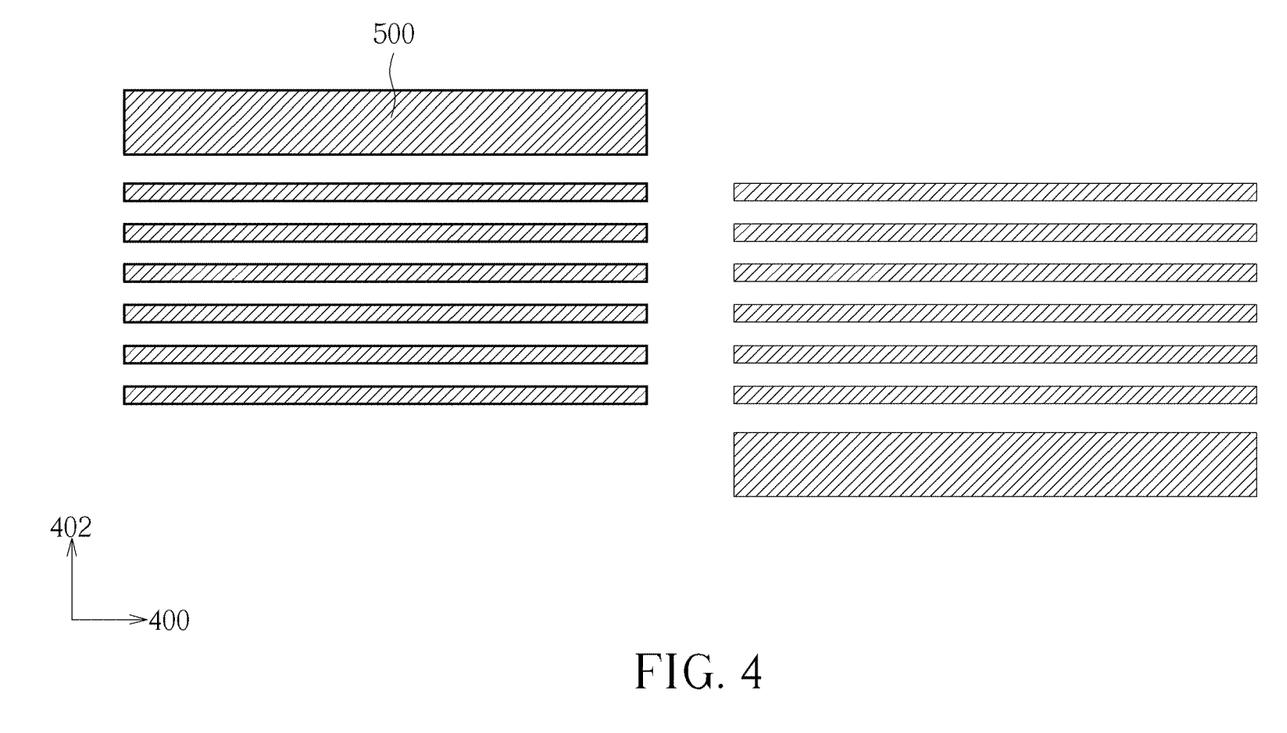
FIG. 4 and FIG. 5 are schematic diagrams illustrating manufacturing steps of an overlay mark of the present invention.
Figure 5:
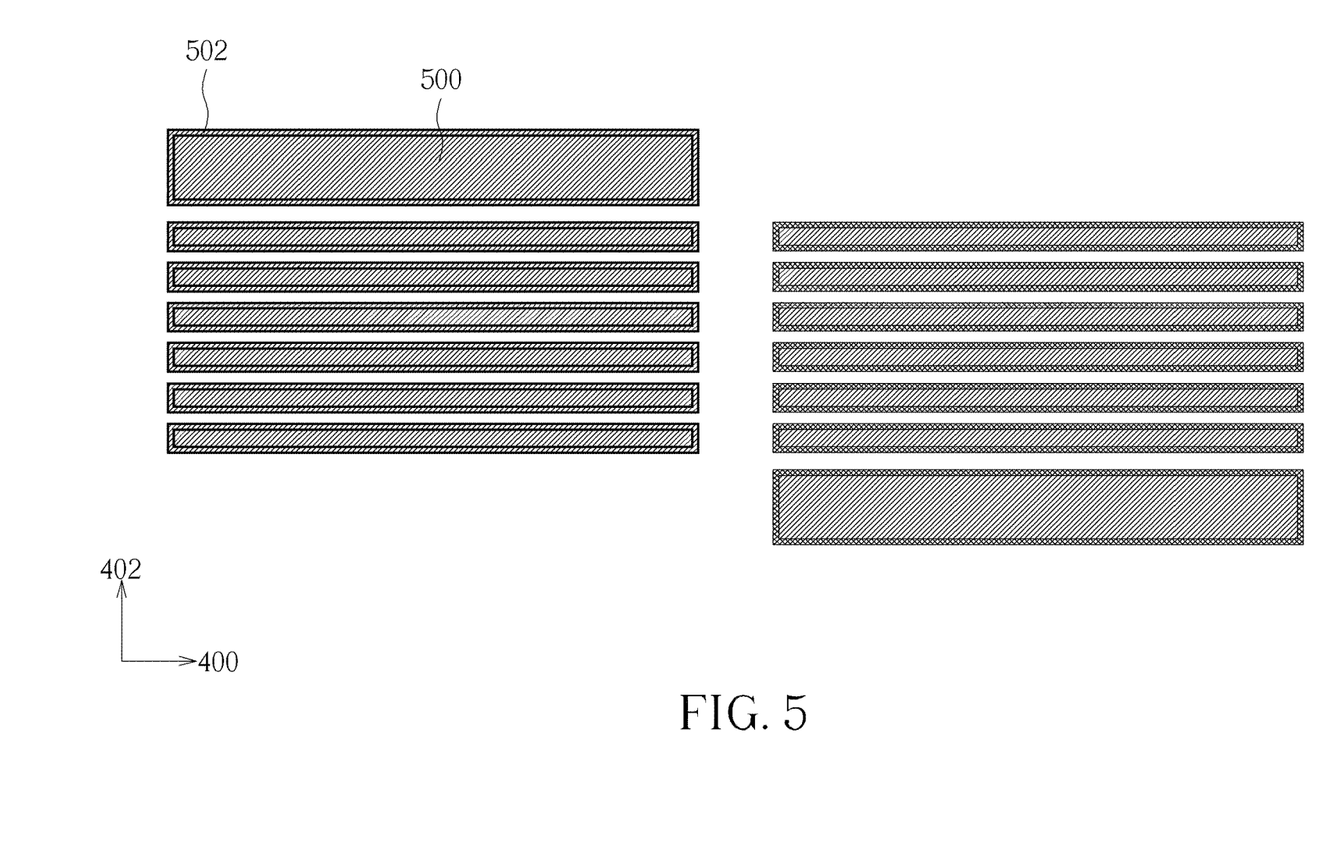

The overlay mark is preferably formed in combination with the self-aligning double patterning, SADP) technology. Please refer to FIG. 4, FIG. 5, and FIG. 3, which illustrating the methods of fabricating the overlay mark according to one embodiment of the present invention. First, as shown in FIG. 4, a patterned mandrel 500 is formed on the substrate 300. The patterned mandrel 500 corresponds to the area encompassed by the big frame 304B and the small frames 304S in the first pattern block 304, and the big frame 306B and the small frame 306S in the second pattern block 306. Next, as shown in FIG. 5, a spacer 502 is formed on the sidewall of the patterned mandrel 500 and surrounds the patterned mandrel 500. The thickness T of the spacer 502 is greater than the distance between each two spacers 502. Lastly, the patterned mandrel 500 is removed so the remained spacer 502 forms the first block pattern 304 and the second block pattern 306.

Figure 6:
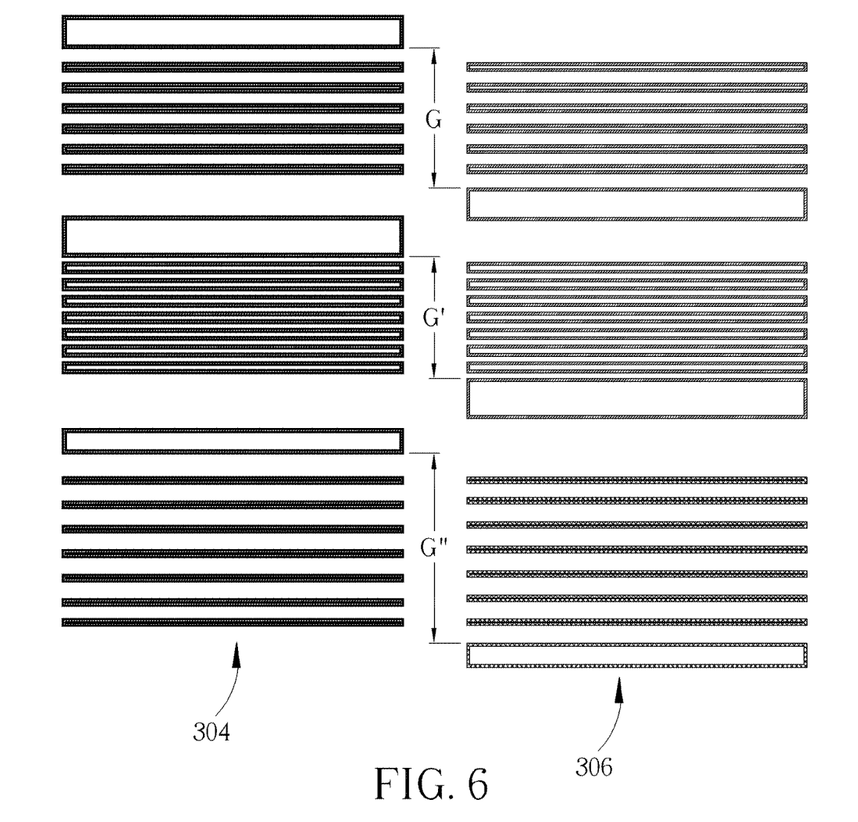
FIG. 6 is a schematic diagram illustrating measuring vary dimension of an overlay mark of the present invention.

By setting plural first pattern blocks 304 and the second pattern blocks 306, the changes of the pitch of the patterned mandrel 500 may be indirectly obtained by measuring the relative positions of patterns in the first pattern blocks 304 and the second pattern blocks 306. Please refer to FIG. 6, which shows a schematic diagram illustrating measuring of the CD change by using the overlay mark in the present invention. As shown in FIG. 6, the top portion of FIG. 6 illustrates a predicted size of the first pattern blocks 304 and the second pattern blocks 306 in the wafer 300, wherein a gap between the big frame 304B of the first pattern block 304 and the big frame 306B of the second pattern blocks 306 is about G. It is noted that, the aforementioned gap refers the projection distance in the second direction 402, between an edge of the big frame 304B of the first pattern blocks 304 and an edge of the big frame 306B of the second pattern blocks 306 which are opposite with each other. Under such arrangement, while the width (CD for example) of the pattern mandrel layer 500 is increased by the changed parameters in the manufacture process, as shown in the middle portion in FIG. 6, the gap G' between the big frame 304B of the first pattern block 304 and the big frame 306B of the second pattern block 306 may decrease accordingly. On the other hand, while the width (CD for example) of the pattern middle-column layer 500 is reduced by the changed parameters in the manufacture process, as shown in the bottom portion in FIG. 6, the gap G" between the big frame 304B of the first pattern block 304 and the big frame 306B of the second pattern block 306 may therefore increase. In this way, it is sufficient to obtain the variation of the width of the patterned mandrel layer 500 through measuring the gap between the big frame 304B and the big frame 306B. For example, if the gap G' is greater than the predict value G, the width of the patterned mandrel layer 500 is presumed to increased. On the other hand, if the gap G" is less than the predict value G, the width of the patterned middle-column layer 500 is presumed to decreased accordingly. Thus, the variation of the dimensions is allowable to be indirectly measured in the present invention, even without using high-resolution photography technique.

Figure 7:
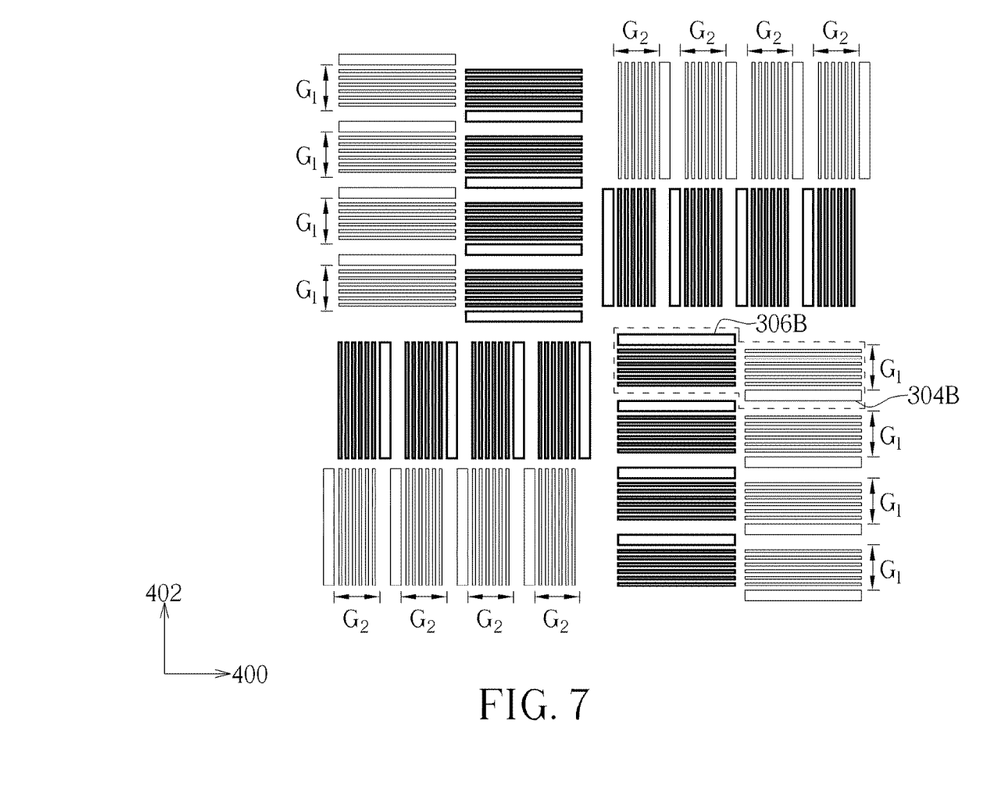
FIG. 7 is a schematic diagram illustrating measuring vary dimension of an overlay mark of the present invention.

By setting plural sets of the first pattern blocks 304 and the second pattern blocks 306 can be used to verify the deviation of the CD, so as to monitor the staleness of the process. Please see FIG. 7, which shows a schematic diagram of methods of monitoring CD value. In the embodiment of FIG. 7, there are eight sets of the first pattern blocks 304 and second pattern blocks 306, wherein the high of the big frame 304B is parallel to that of the first pattern block 304 along the first direction 400, and the big frame 304B and the big frame 304B has a distance $G_1$. By measuring the 8 gaps value $G_1$, a deviation value regarding to the 8 gap $G_1$ along to the second direction 402 can be obtained. When we got G1 values with small difference, it means that the CD value has not great big variation, so the manufacturing stability can be confirmed along the first direction 400. Similarly, there are eight sets of the second pattern blocks 306 and second pattern blocks 308, wherein the high of the big frame 304B is parallel to that of the first pattern block 304 along the first direction 400, and the big frame 304B and the big frame 304B have a distance $G_2$ therebetween. By measuring the 8 gaps value $G_2$, a deviation value representing the CD deviation along to the second direction 402 can be obtained. When we got $G_2$ values with small difference, it means that the CD value has not great big variation, so the manufacturing stability can be confirmed along the first direction 400. It is noted that the sets and the positions of the first pattern block 304 and the second pattern block 306 can be altered arbitrarily according to the design of product.

Figure 8:
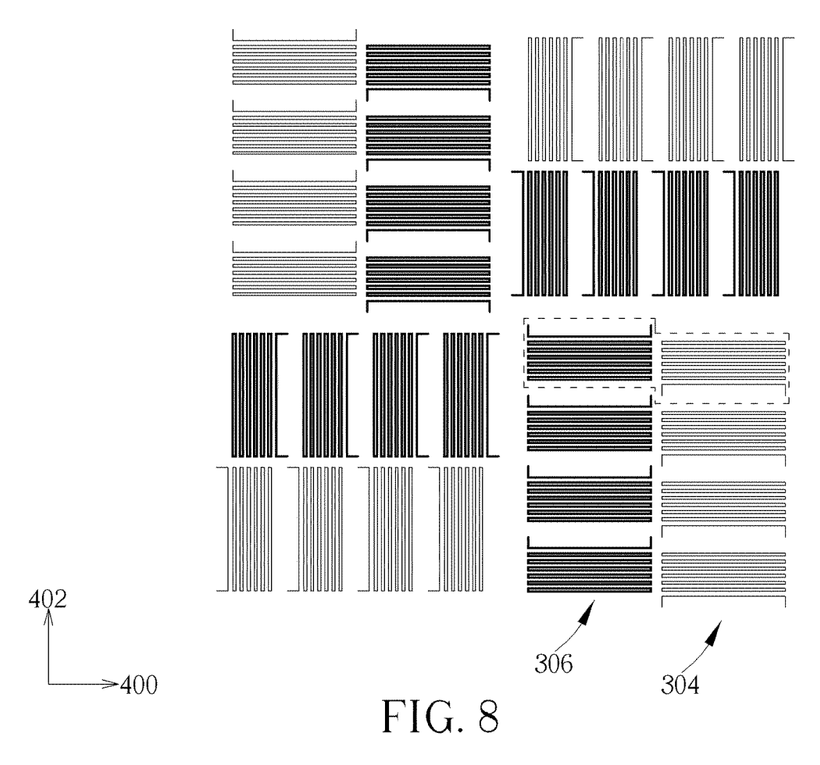
FIG. 8 is a schematic diagram illustrating an overlay mark according to another preferred embodiment of the present invention.

Please refer to FIG. 8, in which an overlay mark according to another preferred embodiment of the present invention is shown. As shown in FIG. 8, after performing the SADP process to form the overlay mark, a cutting process may be additionally performed to cut off portions of the big frame 304B, 306B to form a plurality of half-framed patterns. In a preferred embodiment of the present invention, the big frames 304B remained in the first pattern blocks 304 face to the second pattern blocks 306, and the big frames 306B remained in the second pattern blocks 306 face to the first pattern blocks 304. That is, openings of two half-frame of the big frames 304B, 306B are opposite to each other.

Figure 9:
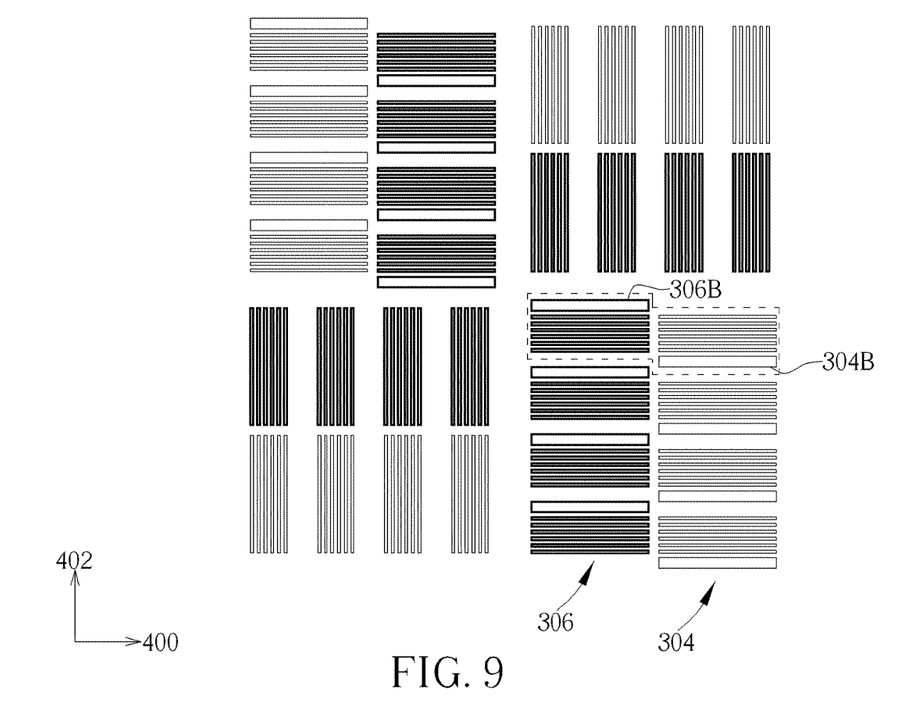
FIG. 9 is a schematic diagram illustrating an overlay mark according to another preferred embodiment of the present invention.

In one embodiment, the measuring pattern may also include the big frame only in one direction. Please refer to FIG. 9, in which an overlay mark according to another preferred embodiment of the present invention is shown. As shown in FIG. 9, only the first measuring patterns 304 and the second measuring patterns 306 paralleled to the first direction 400 have the big frame 304B and the big frame 306B. In other words, the first measuring patterns 304 and the second measuring patterns 306 paralleled to the second direction 402 only include the small frames 304S, 306S instead of the big frames.

Furthermore, the first pattern blocks 304 and the second pattern blocks 306 in one set of the measuring patterns may also be integrated in a general aligning mark, so as to become a part of the general aligning mark or a part of the pre-layer of the general aligning mark. In this way, the variation of the critical dimension may be immediately measured while the aligning process.

Figure 10:
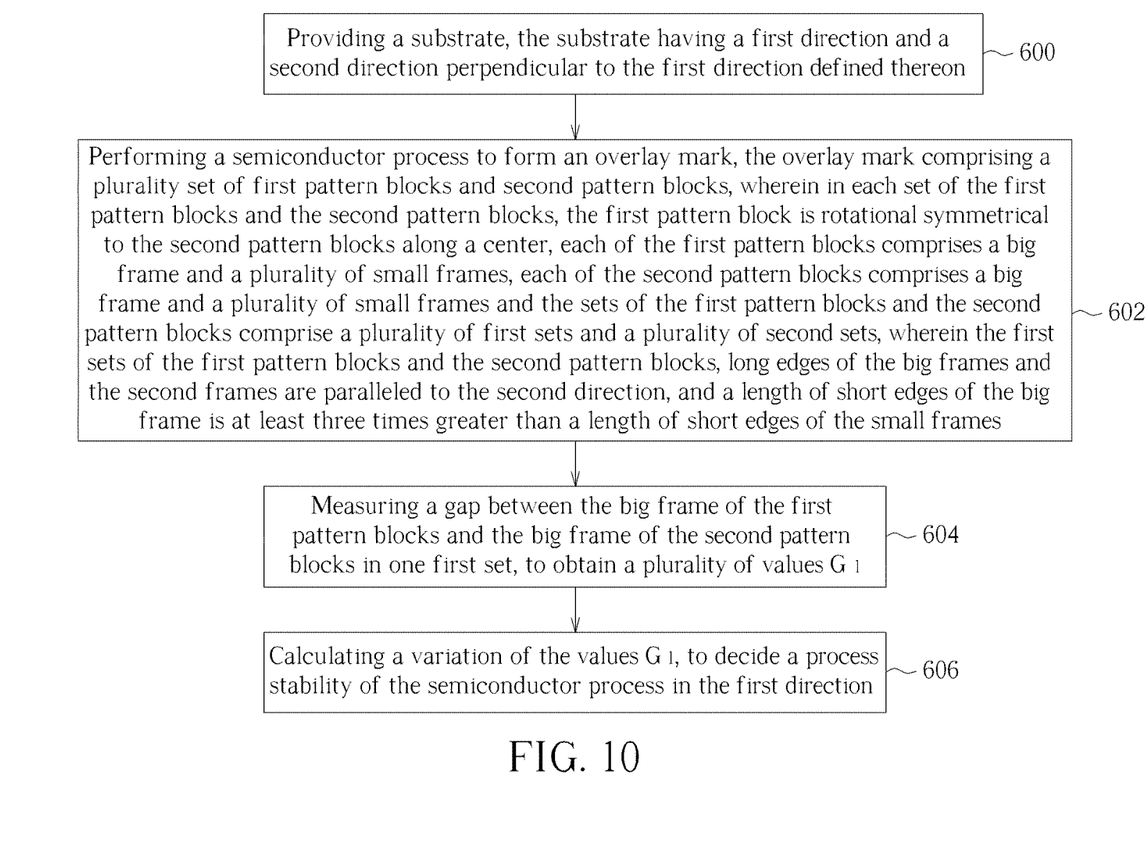
FIG. 10 is a process flow illustrating a method for evaluating process stability of a semiconductor manufacturing process of the present invention.

Please refer to FIG. 10, in which a process flow is shown to illustrate a method of evaluating process stability. As shown in FIG. 10, the method for evaluating process stability includes following steps:

in step 600: providing a substrate, the substrate having a first direction and a second direction perpendicular to the first direction defined thereon;

in step 602: performing a semiconductor process to form an overlay mark, the overlay mark comprising a plurality sets of first pattern blocks and second pattern blocks, wherein in each set of the first pattern block and the second pattern block, the first pattern block is rotational symmetrical to the second pattern blocks along a center, each of the first pattern blocks comprises a big frame and a plurality of small frames, each of the second pattern blocks comprises a big frame and a plurality of small frames and the sets of the first pattern blocks and the second pattern blocks comprise a plurality of first sets and a plurality of second sets, wherein the first sets of the first pattern blocks and the second pattern blocks, long edges of the big frames and the second frames are paralleled to the second direction, and a width of short edges of the big frame is at least three times greater than a width of short edges of the small frames;

in step 604: measuring the overlay mark, to obtain a plurality of values $G_1$;

in step 606: calculating a variation of the values G1, to decide a process stability of the semiconductor process in the first direction.

Overall, the present invention provides an overlay mark and a method for valuating process stability of a semiconductor manufacturing process, and which is preferably integrated with a SADP process, so as to acute measuring the vary widths in the pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overlay mark, comprising:
   a substrate, having a first direction and a second direction perpendicular to the first direction defined thereon; and
   a plurality set of first pattern blocks and second pattern blocks, disposed on the substrate, wherein each of the first pattern blocks comprises a big frame and a plurality of small frames, each of the second pattern blocks comprises a big frame and a plurality of small frames, and widths of the big frames are at least three times greater than widths of the small frames, wherein each small frame in the first pattern blocks and the second pattern blocks is a closed loop, the small frames of the first pattern blocks and the small frame of the second pattern blocks are aligned in a straight line.

2. The overlay mark according to claim 1, wherein the sets of the first pattern blocks and second pattern blocks comprise a plurality of first sets and a plurality of second sets, long edges of the big frames and the small frames in the first sets of the first pattern blocks and second pattern blocks are paralleled to the first direction.

3. The overlay mark according to claim 1, wherein the sets of the first pattern blocks and second pattern blocks comprise a plurality of first sets and a plurality of second sets, long edges of the big frames and the small frames in the second sets of the first pattern blocks and second pattern blocks are paralleled to the second direction.

4. The overlay mark according to claim 1, wherein the overlay mark is a rotational symmetrical pattern.

5. The overlay mark according to claim 1, wherein values of long edges of the big frame is equal to values of long edges of the small frames.

6. The overlay mark according to claim 1, wherein frame thicknesses of the big frames are equal to frame thicknesses of the small frames.

7. The overlay mark according to claim 1, wherein in each set of the first pattern blocks and the second pattern blocks, the first pattern block is rotational symmetrical to the second pattern block along a center.

8. The overlay mark according to claim 1, wherein a number of the small frames of the first pattern blocks is equal to a number of the small frames of the second pattern blocks.

9. The overlay mark according to claim 1, wherein in one set of the first pattern blocks and the second pattern blocks, the big frame comprises a half-frame.

10. The overlay mark according to claim 9, wherein openings of two half-frame of the big frame are opposite to each other.

11. An overlay mark, comprising:
a substrate, having a first direction and a second direction perpendicular to the first direction defined thereon; and
a plurality set of first pattern blocks and second pattern blocks, disposed on the substrate, wherein each of the first pattern blocks comprises a big frame and a plurality of small frames, each of the second pattern blocks comprises a big frame and a plurality of small frames, and widths of the big frames are at least three times greater than widths of the small frames, wherein the big frames reside at a first side of the small frames in the first pattern blocks, and the big frames reside at a second side of the small frames in the second pattern blocks, wherein the first side and the second side are located on opposite sides of the small frames.

12. An overlay mark, comprising:
a substrate, having a first direction and a second direction perpendicular to the first direction defined thereon; and
a plurality set of first pattern blocks and second pattern blocks, disposed on the substrate, wherein each of the first pattern blocks comprises a big frame and a plurality of small frames, each of the second pattern blocks comprises a big frame and a plurality of small frames, and widths of the big frames are at least three times greater than widths of the small frames, wherein one of the first pattern blocks and one of the second pattern blocks are disposed side-by-side extending in the first direction, respectively, and the one of the first pattern blocks and the one of the second pattern blocks are orderly-arranged along the second direction upon rotation along a center.

13. An overlay mark, comprising:
a substrate, having a first direction and a second direction perpendicular to the first direction defined thereon; and
a plurality set of first pattern blocks and second pattern blocks, disposed on the substrate, wherein each of the first pattern blocks comprises a big frame and a plurality of small frames, each of the second pattern blocks comprises a big frame and a plurality of small frames, and widths of the big frames are at least three times greater than widths of the small frames, wherein the big frame of one of the second pattern blocks is invertedly staggeredly arranged in an offset configuration with respect to the big frame of one of the first pattern blocks, within one of the sets of the first pattern blocks and the second pattern blocks disposed side-by-side.

* * * * *